United States Patent [19]

Redman et al.

[11] Patent Number: 4,691,339

[45] Date of Patent: Sep. 1, 1987

[54] ADDRESS CODE ARRANGEMENTS

[75] Inventors: Michael J. Redman, Bishops Stortford; Ming K. Wong, Harlow; Peter R. Sugden, Brighouse, all of England

[73] Assignee: STC plc, London, England

[21] Appl. No.: 764,114

[22] Filed: Aug. 9, 1985

[30] Foreign Application Priority Data

Sep. 4, 1984 [GB] United Kingdom ............... 8422288

[51] Int. Cl.$^4$ ................................................ H04Q 7/04
[52] U.S. Cl. ....................................... 379/62; 379/61; 235/492
[58] Field of Search ........... 179/6.3 CC, 2 CA, 2 EA; 235/441, 492, 495, 494; 379/61, 62, 99, 91

[56] References Cited

U.S. PATENT DOCUMENTS

| | | | |
|---|---|---|---|
| 3,022,381 | 2/1962 | Pferd | 179/6.3 CC |
| 3,647,972 | 3/1972 | Glover et al. | 179/2 DP |
| 3,666,925 | 5/1972 | Marcus | 235/492 |
| 3,876,865 | 4/1975 | Bliss | 235/492 |
| 4,044,229 | 8/1977 | Samreus | 235/492 |
| 4,255,653 | 3/1981 | Borkat et al. | 235/495 |
| 4,517,412 | 5/1985 | Newkirk et al. | 179/7.1 R |
| 4,539,472 | 9/1985 | Poetker et al. | 235/488 |
| 4,560,832 | 10/1985 | Bond et al. | 179/2 EA |

*Primary Examiner*—Robert Lev
*Attorney, Agent, or Firm*—Kerkam, Stowell, Kondracki & Clarke

[57] ABSTRACT

In a cordless telephone it is usual for the base station and the handset to be allotted a single address code to provide "dial security". Such an address code is usually programmed in during manufacture. In the present arrangement, a printed circuit board (2) in the handset or base station bears a single common track (5) and a set of tracks (6) adjacent to it. Each cordless set's two units also has a label (1) with a set of conductive strips on it which is secured to the board so as to connect the common track and a selection of the individual tracks. Thus energization of the common track (5) energizes a selection of the tracks (6) according to the address.

When a number is to be sent the address code defined by the handset's label is sent to the base station and compared with that for the base station's label. If they agree, "dialling" is permitted.

The label can also be wrapped round the edge of the board or plugged into a socket on the board.

1 Claim, 1 Drawing Figure

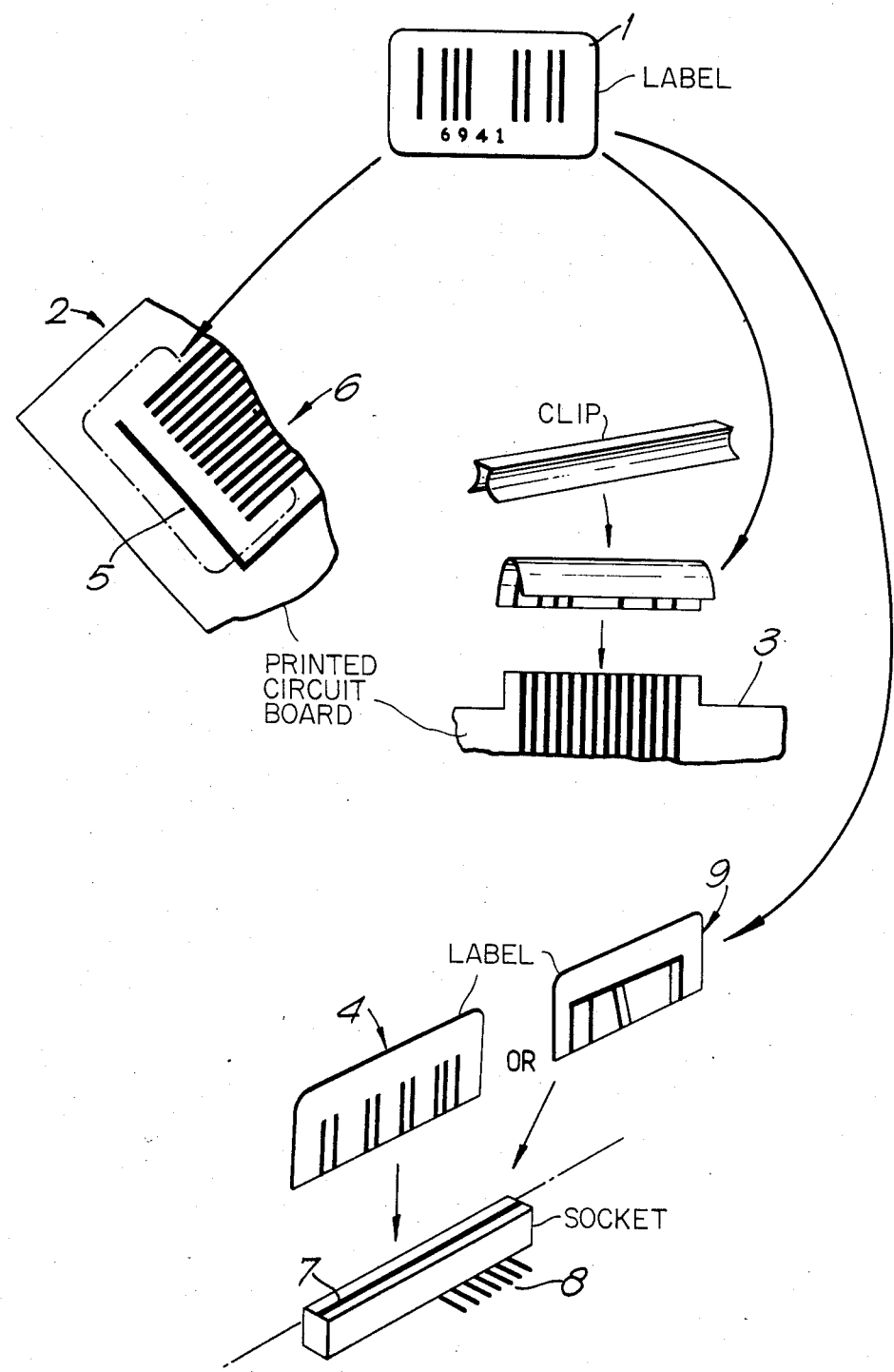

ADDRESS CODE ARRANGEMENTS

BACKGROUND OF THE INVENTION

The present invention relates to arrangements for the provision of individual addresses or other identification information for use in cordless telephones.

Cordless telephones are often provided with "dial" security, the base station and the module handset being given a unique identity and only being operable as a pair. This prevents unauthorized use of the telephone line via the base station, by someone with a handset tuned to the same frequencies as the base station. The base station's operating protocol ensures that a call is only set up is the identity number of the mobile handset corresponds to that of the base station. This identity number is usually stored in a ROM (Read Only Memory) and has to be programmed in during assembly. In the United Kingdom cordless telephone system there are eight separate two-way channels, with 10,000 identity codes on each channel.

We are aware of British Patent Specification No. 1537102 (N. Samreus), which relates to a programmable timepiece, e.g. an appointments reminder, which produces an output, e.g. to operate an aural or visual alarm, at predetermined instant(s) designated by marks written on a support member calibrated in time intervals, e.g. hours and minutes. Various programming means are described in this Patent Specification, mostly using conductive inks sometimes on labels to bridge gaps between conductive paths as in an appointment sheet.

SUMMARY OF THE INVENTION

An object of the invention is to provide a relatively simple and inexpensive way to provide unique identity codes for equipment such as cordless telephones.

According to the invention there is provided an addressing arrangement for use in the handset and/or in the base station of a cordless telephone set, which includes a circuit board having a contact field formed by a single strip-like conductive track to which a power supply may be connected when the arrangement is in use and a set of conductive tracks on the board each of which terminates adjacent to the strip-like track, and a label or the like of an insulating material which carries a set of conductive strips, the pattern of said strips on the label corresponding to an identification address for the handset or base station, wherein when the arrangement is in use the label is secured to the board so that the conductive strips on the label connect the single strip-like track on the board to a selection of the conductive tracks on the board, which selection corresponds to the identification address of the handset or base station, and wherein read-out means for the identification number is provided responsive to the energization produced via the strips on the label at the set of tracks due to an energization of the strip-like track.

In a cordless set, both the handset and the base station have arrangements as set out above, and "dialling" is only possible from the handset if its label corresponds to the same address as does the label on the base station.

It will be seen that we have appreciated that the address label technique described by Samreus in the above-identified British Patent Specification has a useful and inventive application in cordless telephone sets. It ensures that a person whos is less than honest cannot use his own handset to set up a call via another subscriber's base station when that subscriber's handset is "off-base". If such calls via another base station could be set up they would be charged to the subscriber appropriate to that base station, which causes some irritation to a subscriber who finds that his is being charged for other persons' calls.

BRIEF DESCRIPTION OF THE DRAWING

Embodiments of the invention will now be described with reference to the accompanying drawing.

DESCRIPTION OF THE PREFERRED EMBODIMENTS

The labels 1 used in the present arrangement, see FIG. 1, are rectangular, and each has on one face a pattern of bars which represents the label's number. This label is fixed by some suitable means such as two screws fitted through holes into corresponding holes in the printed circuit board of the telephone, where it interconnects a single common terminal of strip form and a set of terminals, or two sets of terminals. Various such means are shown in FIG. 1. Thus as an example, it can be stuck to the printed circuit board, as indicated at 2, or the label can be clipped to the board as indicated at 3, or inserted into a socket as indicated at 4.

When thus secured to the printed circuit board, the label interconnects a single common track or terminal 5, and respective ones of a set of tracks or terminals 6. In the "clipped-on" case, the label is folded over the edge of the board, where it interconnects tracks on one face of the board and a common track on the other face of the board. In the socket case the label connects one common conductor indicated at 7 and a set of tracks indicated at 8. Alternatively, the common connection may be made by a linking track on the label itself, as indicated at 9 in the drawing, connecting to a contact of the socket. This enables a standard single-sided edge connector to be used.

In other cases the label may be used to interconnect two sets of tracks, instead of one common conductor and a set of tracks.

The labels are printed as a continuous roll, using a print mechanism which provides a sequence of identification codes. The well-known hot foil process gives satisfactory results; this applies a thin metallic film to an article, which can be of a variety of material including plastics, paper, card and leather. As the resistance of the printed label's conductive bars, and its contact resistance with the printed circuit board may not be particularly low, it is desirable for the set of tracks mentioned above to be interfaced to CMOS circuitry to ensure reliability.

In a simpler arrangement, usable, for instance, under emergency conditions, the label is dispensed with, and the links provided by the conductive strips thereon are provided by rubbing a soft pencil between the tracks on the circuit board. The address thus applied can be altered by erasing the pencil tracks and drawing in new ones. The durability of a pattern of strips thus applied is low when using a pencil, but some form of conductive ink could be used instead. Examples are Elecolit 340, or a colloidal suspension such as Aquadag. In such a case the method has to be implemented at assembly, but it is less expensive in computers than the ROM usually used.

In use, when the telephone subscriber with a cordless set picks up his handset, the first digit to be "dialled" causes the address identified by the label in the handset to be signalled to the base station. This transmission precedes that first digit, and on reception in the base station the address is compared with that for the base station. Only if the two addresses thus compared are identical is the "dialling" rendered effective.

The word "dialled" and "dialling" are put in inverted commas because in practice the digit sending usually uses push-buttons.

We claim:

1. An addressing arrangement for use in the handset and/or in the base station of a cordless telephone set, which arrangement includes:
   (a) a circuit board having a contact field formed by a single strip-like conductive track to which a power supply is connected when the arrangement is in use and a set of conductive tracks on the board each of which terminates adjacent to the single strip-like track, the tracks of said set extending substantially orthogonally to the single strip-like track;
   (b) label means of insulative material for carrying a set of generally parallel conductive strips, the pattern of said strips on the label means corresponding to an identification address for the handset or base station; and
   (c) means to secure the said label means to the circuit board of the handset or base station such that the conductive strips on the label connect the single strip-like track on the board to a selection of the conductive tracks on the board, which selection corresponds to the identification address of the handset or base station;
wherein when the handset or base station with the addressing arrangement is in use the single strip-like track is energized so that the said selection of the tracks on the circuit board which corresponds to the address is energized, and wherein the establishment of a connection is only effected if the address of the handset and the base station correspond.

* * * * *